(12) United States Patent
Wallash

(10) Patent No.: US 8,264,233 B2
(45) Date of Patent: Sep. 11, 2012

(54) MAGNETORESISTIVE ELECTROSTATIC DISCHARGE (ESD) DETECTOR

(75) Inventor: Albert Wallash, Morgan Hill, CA (US)

(73) Assignee: Hitachi Global Storage Technologies, Netherlands B.V., Amsterdam (NL)

( * ) Notice: Subject to any disclaimer, the term of this patent is extended or adjusted under 35 U.S.C. 154(b) by 485 days.

(21) Appl. No.: 12/511,780

(22) Filed: Jul. 29, 2009

(65) Prior Publication Data

US 2011/0025339 A1    Feb. 3, 2011

(51) Int. Cl.
*G01R 29/12* (2006.01)
(52) U.S. Cl. .................. 324/452; 324/457
(58) Field of Classification Search ........... 324/457, 324/452
See application file for complete search history.

(56) References Cited

U.S. PATENT DOCUMENTS

| | | | |
|---|---|---|---|
| 5,123,102 A | 6/1992 | Puckette | |
| 5,359,319 A | 10/1994 | Campbell et al. | |
| 5,796,256 A | 8/1998 | Fowler et al. | |
| 6,014,305 A | 1/2000 | Yu | |
| 6,583,612 B2 | 6/2003 | Karins et al. | |
| 7,151,655 B2 | 12/2006 | Choo | |
| 7,161,772 B2 | 1/2007 | Iben | |
| 2008/0145958 A1 | 6/2008 | Abou-Khalil et al. | |

FOREIGN PATENT DOCUMENTS

JP    2004309172    11/2004

OTHER PUBLICATIONS

Jacksen, Niels et al., "Advances in Magneto Optical Static Event Detector Technology", *ExMod Corporation*, Jul. 29, 2009.
Steinman, Arnie et al., "Detecting ESD Events in Automated Processing Equipment", *Compliance Engineering* (www.ce-mag.com), (2000).

*Primary Examiner* — Vincent Q Nguyen

(57) ABSTRACT

A magnetoresistive electrostatic discharge (ESD) event detector includes at least one magnetoresistive device. The at least one magnetoresistive device detects an ESD event in an ESD sensitive device based on magnetoresistive properties of the at least one magnetoresistive device. The magnetoresistive device has an ESD failure level that is lower than the ESD failure level of said ESD sensitive device.

12 Claims, 3 Drawing Sheets

300

Electrically couple a magnetoresistive ESD event detector to an ESD sensitive device. The magnetoresistive ESD event detector comprises at least one magnetoresistive device comprising an ESD sensitivity level that is greater than an ESD sensitivity level of the ESD sensitive device
310

Electrically couple a magnetoresistive ESD event detector in series to an ESD sensitive device.
312

Electrically couple a magnetoresistive ESD event detector in parallel to an ESD sensitive device
314

Test magnetoresistive properties of the at least one magnetoresistive device to determine if the ESD sensitive device was subject to an ESD event level. The ESD event level is greater than the ESD sensitivity level of the at least one magnetoresistive device.
320

Test a pinned layer reversal of the at least one magnetoresistive device in response to the ESD event level greater than the ESD sensitivity level of the at least one magnetoresistive device
330

Test a resistance increase of the at least one magnetoresistive device in response to the ESD event level greater than the ESD sensitivity level of the at least one magnetoresistive device
340

Test a resistance decrease of the at least one magnetoresistive device in response to the ESD event level greater than the ESD sensitivity level of the at least one magnetoresistive device
350

Test magnetoresistive properties of a plurality of magnetoresistive devices. The plurality of magnetoresistive devices comprises a different ESD sensitivity level.
360

FIG. 3

MAGNETORESISTIVE ELECTROSTATIC DISCHARGE (ESD) DETECTOR

FIELD

Embodiments of the present technology relates generally to the field of electrostatic discharge (ESD).

BACKGROUND

Electrostatic discharge (ESD) often destroys or damages electronic devices during processing and/or handling of the electronic devices. As electronic devices become smaller and more sensitive to applied voltages and currents, the electronic devices also become more sensitive to ESD. It is often very difficult, if not virtually impossible, to determine the source of an ESD event or even when electronic devices are subject to an ESD event. Typically, in order to determine that an electronic device has been damaged by an ESD event, the electronic device is pulled from a manufacturing line and tested to determine if the electronic device has failed or not. Even if it is determined that an electronic device has failed due to an ESD event and subsequently unable to be used for an end product, it is often impossible to determine the level of current transient of the ESD event that caused the electronic device to fail.

Moreover, electronic devices are often subject to an ESD event of a specific level that damages the electronic device but the damage does not cause complete failure of the electronic device. The ESD testing device is unable to determine that the electronic device has been damaged because the electronic device has not completely failed and is still functional. However, the damaged electronic device is still used for an end product and subsequently fails after further use of the end product.

BRIEF DESCRIPTION OF THE DRAWINGS

FIG. 3 illustrates an example of a flow chart of a method for detecting an ESD event, in accordance with an embodiment of the present invention.

Figure 1:
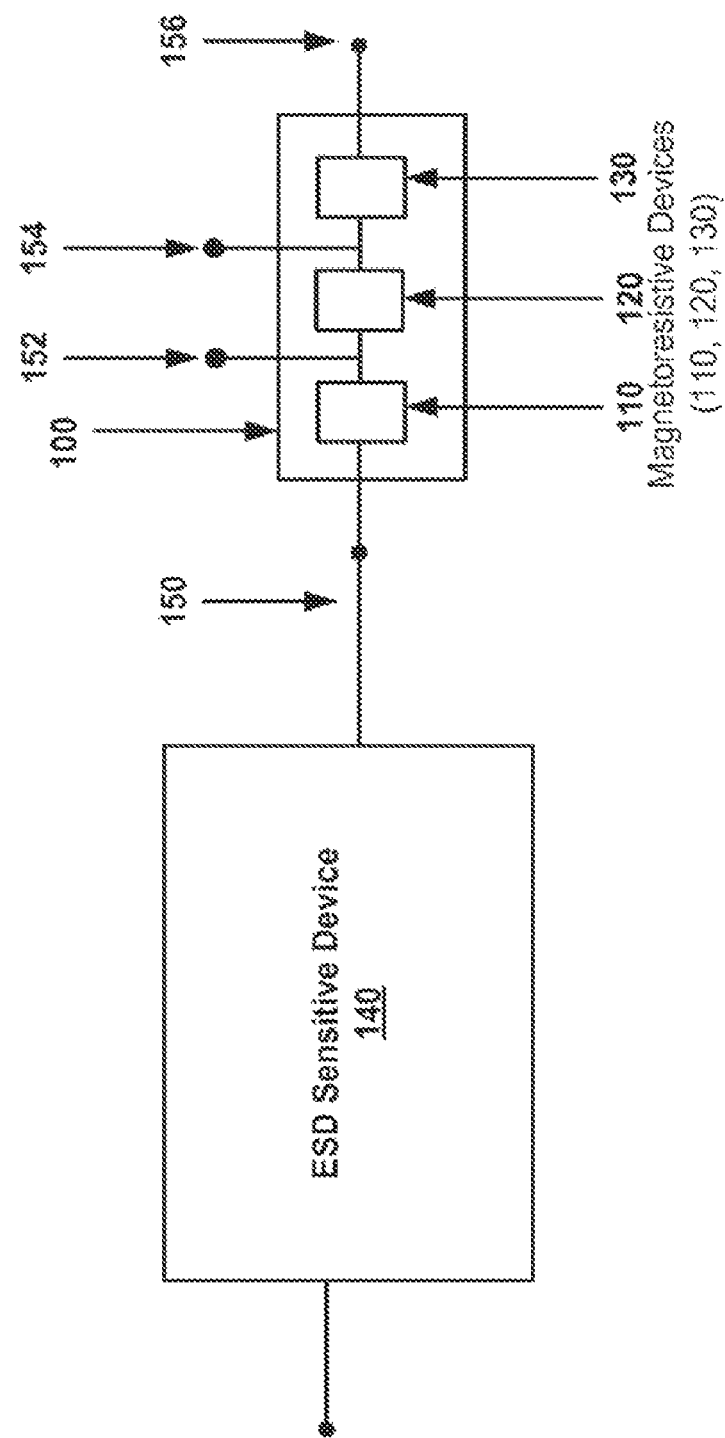
FIG. 1 illustrates an example of a magnetoresistive ESD event detector, in accordance with an embodiment of the present invention.

The drawings referred to in this description should be understood as not being drawn to scale except if specifically noted.

DESCRIPTION OF EMBODIMENTS

Reference will now be made in detail to embodiments of the present technology, examples of which are illustrated in the accompanying drawings. While the technology will be described in conjunction with various embodiment(s), it will be understood that they are not intended to limit the present technology to these embodiments. On the contrary, the present technology is intended to cover alternatives, modifications and equivalents, which may be included within the spirit and scope of the various embodiments as defined by the appended claims.

Furthermore, in the following description of embodiments, numerous specific details are set forth in order to provide a thorough understanding of the present technology. However, the present technology may be practiced without these specific details. In other instances, well known methods, procedures, components, and circuits have not been described in detail as not to unnecessarily obscure aspects of the present embodiments.

ESD often destroys or damages electronic devices during the processing and/or handling of the electronic devices. The damage to the electronic devices are classified generally as a complete failure of the electronic device or "walking wounded." It is simple to test whether a device has fully failed or not because the electronic device is simply destroyed or clearly does not function as designed. However, it is very difficult to determine if a damaged electronic device is a walking wounded. The walking wounded electronic device, when tested, may still have test results that portray the electronic device as not damaged however the damage from the ESD is not detected by the testing device.

It is very difficult, if not impossible, to determine when and where an ESD event occurred within the manufacturing and handling steps that damages the electronic devices, especially an ESD event that creates a walking wounded. For example, there are hundreds of steps within the manufacturing process where the ESD even can occur. Also, the ESD event may be intermittent.

An ESD testing device is used to determine if an electronic device has been subject to an ESD event and whether or not the electronic device has failed due to an ESD event. In other words, the ESD testing device determines only if an electronic device has been subject to an ESD event that causes failure or not. The ESD testing device typically does not measure the level(s) of current and/or voltage applied to the electronic device from an ESD event.

Typically, an electronic device is tested after it is pulled from a manufacturing line. If the electronic device has been subject to an ESD event that causes failure of the device, then the testing device will be able to determine that the electronic device has failed and subsequently will not be used for an end product. However, the ESD testing device generally has an ESD sensitivity that is less than the ESD sensitivity of the electronic device. This discrepancy of ESD sensitivity between the electronic device and the ESD testing device does not allow the ESD testing device to determine if the electronic device has been subject to an ESD event that may cause a walking wounded.

An embodiment in accordance with the present invention provides a magnetoresistive ESD event detector 100 for detecting an ESD event subjected to an ESD sensitive device 140, as shown in FIG. 1. The magnetoresistive ESD event detector 100 includes magnetoresistive devices 110, 120 and 130. A magnetoresistive device uses magnetoresistance properties. Magnetoresistance is the property of a material changing its value of electrical resistance when an external magnetic field is applied to it. It should be appreciated that the magnetoresistive ESD event detector 100 includes at least one magnetoresistive device. It should also be appreciated that an ESD event can be but is not limited to a current transient and/or voltage that is applied to the ESD sensitive device 140. The ESD sensitive device 140 can be any electronic device that can be deleteriously affected by an ESD event, such as but not limited to an integrated circuit (IC), laser diodes, MEMS and the like. The ESD sensitive device 140 is depicted having two terminals with one terminal attached to the magnetoresistive ESD event detector 100, however, it should be appreciated that the ESD sensitive device 140 includes at least one terminal.

The ESD event detector 100 detects an ESD event in the ESD sensitive device 140 based on magnetoresistive properties of the ESD event detector 100. In one embodiment, the magnetoresistive devices 110, 120 and 130 are magnetoresistive read transducers, such as but not limited to a giant magnetoresistive (GMR) transducer, a current-perpendicular-to-the-plane giant magnetoresistive (CPP GMR) transducer and a tunneling magnetoresistive (TMR) transducer.

Generally, a magnetoresistive head employs a special conductive material that changes its resistance in the presence of a magnetic field. As the head passes over the surface of the disk, this material changes resistance as the magnetic fields change corresponding to the stored patterns on the disk. A sensor is used to detect these changes in resistance, which allows the bits on the platter to be read.

GMR and CPP GMR transducers are read heads that use the giant magnetoresistive effect and typically include four layers of thin material: free layer, spacer, pinned layer and exchange layer. When the head passes over a magnetic field of one polarity, the free layer has its electrons turn to be aligned with those of the pinned layer; this creates a lower resistance in the entire head structure. When the head passes over a magnetic field of the opposite polarity, the electrons in the free layer rotate so that they are not aligned with those of the pinned layer. This free layer rotation causes an increase in the resistance of the overall structure. The resistance changes are caused by changes to the spin characteristics of electrons in the free layer.

A TMR transducer is a read head that uses the tunnel magnetoresistive effect, which is the effect accompanied by a change in the tunneling probability of the electron passing through the insulated layer sandwiched by two magnetic layers.

Magnetoresistive properties of a GMR or a CPP GMR that facilitate in the detection of an ESD event are a pinned layer reversal due to an applied magnetic field to the GMR and a subsequent increase in resistance. In a GMR or a CPP GMR, a pin layer is in an initial pin layer orientation. If the GMR or CPP GMR is introduced to a magnetic field having a strength to reverse the pin layer orientation, then the pin layer orientation will be reversed. If there is a pinned layer reversal in the GMR or a CPP GMR, then the resistance of the GMR or CPP GMR will increase compared to its initial resistance before pinned layer reversal. For example, a current transient from an ESD event applied to an electronic device will cause a corresponding magnetic field. If the magnetic field is of a strength that will cause a pinned layer reversal, then the GMR or CPP GMR will have a pinned layer reversal and subsequent increase in resistance. It should be appreciated that GMR and CPP GMR are current sensitive magnetoresistive devices.

The resistance of the GMR and GMR CPP due to the pinned layer reversal can be measured by any electrical testing device that is able to test the resistance of an electrical device. The pinned layer reversal can be measured by a transfer curve tester, which is also referred to as a quasi-static tester (QST). A QST tester applies a slowing varying magnetic field to the electronic device and monitors the resistance of the electronic device. If the pin layer is reversed, then the actual slope of the resistance versus the magnetic field reverses or flips.

A magnetoresistive property of a TMR is a decrease in resistance due to the applied voltage corresponding to a current transient of an ESD event. In a voltage sensitive device, if there is a too large of an applied voltage, the device will be damaged. For example, the voltage sensitive device may heat up and melt when there is too large of an applied voltage. It should be appreciated that the resistance of a TMR can be measured by any electrical testing device that is able to test the resistance of an electrical device.

The magnetoresistive ESD event detector 100 has an ESD sensitivity level that is higher than ESD sensitive device 140. For example, an electrical device can be damaged by an ESD event having a voltage, $V_2$, and therefore has an ESD sensitivity level of $V_2$. The ESD event detector 100 can detect an ESD event of $V_1$ which is less than $V_2$ and therefore ESD event detector 100 has an ESD sensitively level greater than the ESD sensitivity level of the ESD sensitive device 140. It should be appreciated that the at least one magnetoresistive device in the magnetoresistive ESD event detector 100 has an ESD sensitively level greater than the ESD sensitively level of the ESD sensitive device. FIG. 1 depicts the ESD event detector 100 which includes magnetoresistive devices 110, 120 and 130, however, it should be appreciated that the ESD event detector includes at least one magnetoresistive device having an ESD sensitivity level that is greater than the ESD sensitivity level of the ESD sensitive device 140.

In one embodiment, the ESD sensitivity level of a magnetoresistive device is adjustable by changing the cross-sectional area of the magnetoresistive device. In another embodiment, the ESD sensitivity level of a magnetoresistive device is adjustable by changing the thickness of the magnetoresistive device. For example, the barrier of the TMR head could be adjusted to produce a desired ESD detection level or ESD sensitivity level.

FIG. 1 depicts the magnetoresistive ESD event detector 100 electrically coupled in series with the ESD sensitive device 140. Likewise, the magnetoresistive devices 110, 120 and 130 are also electrically coupled in series with each other and with the ESD sensitive device 140. The magnetoresistive devices 110, 120 and 130, each have different discrete ESD sensitively levels with at least one device having an ESD sensitivity level greater than the sensitivity level of the ESD sensitive device 140.

For example, an ESD sensitive device can be damaged and become a walking wounded from an ESD event having a voltage of $V_1$. The magnetoresistive device 110 has an ESD sensitivity level of $V_3$, magnetoresistive device 120 has an ESD sensitivity level of $V_2$ and magnetoresistive device 130 has an ESD sensitive level of $V_1$, where $V_3>V_2>V_1$. An ESD event of $V_1$ applied to the ESD event detector and likewise to the ESD sensitive device would be detected only by the magnetoresistive device 130 having an ESD sensitivity level of $V_1$. Accordingly, magnetoresistive devices 110 and 120 would not detect the ESD event of $V_1$. In other words, the ESD event of $V_1$ would be detected only by magnetoresistive device 130 because magnetoresistive device 130 changed magnetoresistive state and magnetoresistive devices 110 and 120 did not change magnetoresistive states. It should be appreciated that the detection of the ESD event of $V_1$ would be detected based on the change of magnetoresistive properties, as described above, of the magnetoresistive device 130. It should also be appreciated that the detection of an ESD event is observed by testing the magnetoresistive properties, as described above, of the magnetoresistive devices.

The testing of the magnetoresistive properties is provided by any electrical testing device that is able to test the resistance of an electrical device and/or a QST. For example, the testing of magnetoresistive device 110 would be facilitated by a testing device coupled to leads 150 and 152, the testing of magnetoresistive device 120 would be facilitated by a testing device coupled to leads 152 and 154 and the testing of magnetoresistive device 130 would be facilitated by a testing device coupled to leads 154 and 156.

If there is an ESD event, then the current transient flows through all three magnetoresistive devices 110, 120 and 130. In other words, all three magnetoresistive devices see the same current. It should be appreciated that the ESD sensitive device 140 that is electrically coupled in series with a magnetoresistive ESD event detector is a current sensitive device.

In one embodiment, the magnetoresistive ESD event detector 100 is physically smaller than the ESD sensitive device 140 and electrically coupled in series with the ESD sensitive device 140. It should be appreciated that the physical dimensions of the magnetoresistive ESD event detector 100 such as but not limited to length, height and/or width are smaller than the length, height and/or width of the ESD sensitive device 140. The magnetoresistive ESD event detector 100 can also be electrically coupled to the ESD sensitive device 140 during the manufacturing and/or handling of the ESD sensitive device. The magnetoresistive ESD event detector 100 is physically smaller than the ESD sensitive device 140 such that the magnetoresistive ESD event detector 100 does not physically interfere with any manufacturing and/or handling processes of the magnetoresistive ESD event detector 100. Additionally, the magnetoresistive ESD event detector 100 attached during the manufacturing and/or handling processes facilitates in the detection of when and where an ESD event occurs within the manufacturing and/or handling processes.

Some examples of manufacturing processes that can cause ESD damage are operations involving soldering, wire bonding, gold ball bonding of wires to the device inputs.

Figure 2:
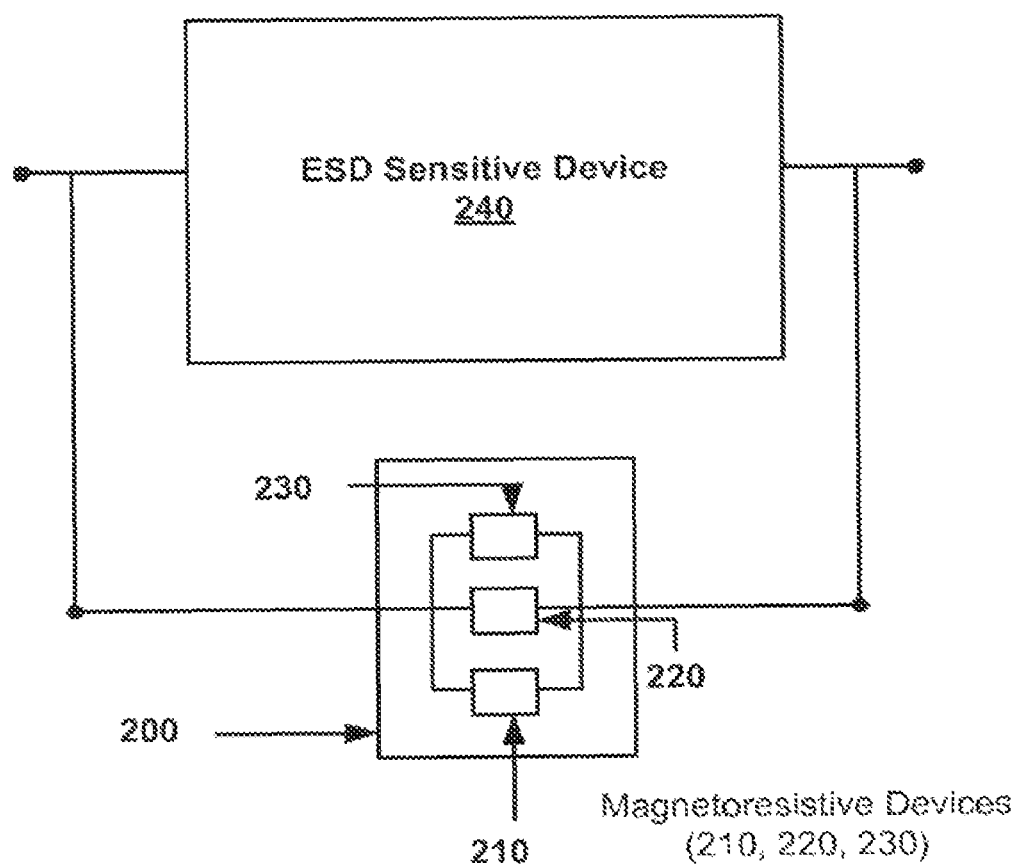
FIG. 2 illustrates an example of a magnetoresistive ESD event detector, in accordance with an embodiment of the present invention.

An embodiment in accordance with the present invention provides a magnetoresistive ESD event detector 200 for detecting an ESD event subjected to an ESD sensitive device 240, as shown in FIG. 2. The magnetoresistive ESD event detector 200 includes magnetoresistive devices 210, 220 and 230. It should be appreciated that FIG. 2 is similar to FIG. 1 except that ESD event detector 200 is electrically coupled in parallel to ESD sensitive device 240. Likewise, magnetoresistive devices 210, 220 and 230 are electrically coupled in parallel to each other and accordingly electrically coupled in parallel to ESD sensitive device 240. FIG. 2 depicts the ESD event detector 200 which includes magnetoresistive devices 210, 220 and 230, however, it should be appreciated that the ESD event detector includes at least one magnetoresistive device having an ESD sensitivity level that is greater than the ESD sensitivity level of the ESD sensitive device 240.

The magnetoresistive devices 210, 220 and 230, each have discrete and different ESD sensitively levels with at least one device having an ESD sensitivity level that is greater than the sensitivity level of the ESD sensitive device 240. For example, an ESD sensitive device can be damaged and become a walking wounded from an ESD event having a current of $l_1$. The magnetoresistive device 210 has an ESD sensitivity level of $l_3$, magnetoresistive device 220 has an ESD sensitivity level of $l_2$ and magnetoresistive device 230 has an ESD sensitive level of $l_1$, where $l_3 > l_2 > l_1$. An ESD event of $l_1$ applied to the ESD event detector 200 and likewise to the ESD sensitive device 240 would be detected only by the magnetoresistive device 230 having an ESD sensitivity level of $l_1$. Accordingly, magnetoresistive devices 210 and 220 would not detect the ESD event of $l_1$. In other words, the ESD event of $l_1$ would be detected only by magnetoresistive device 230 because magnetoresistive device 230 changed magnetoresistive state and magnetoresistive devices 210 and 220 did not change magnetoresistive states. It should be appreciated that the detection of the ESD event of $l_1$ would be detected based on the change of magnetoresistive properties, as described above, of the magnetoresistive device 230. It should also be appreciated that the detection of an ESD event is observed by testing the magnetoresistive properties, as described above, of the magnetoresistive devices.

The testing of the magnetoresistive properties is provided by any electrical testing device that is able to test the resistance of an electrical device and/or a QST. For example, the testing of magnetoresistive devices 210, 220 and 230 would be facilitated by a testing device coupled to leads of the magnetoresistive devices.

If there is an ESD event, then the same voltage flows through magnetoresistive devices 210, 220 and 230, and the ESD sensitive device 240, because the devices and coupled in parallel. It should be appreciated that the ESD sensitive device 240 that is electrically coupled in parallel with a magnetoresistive ESD event detector 200 is a voltage sensitive device.

It should be appreciated that a plurality of magnetoresistive ESD event detectors can be electrically coupled in series and/or parallel with an ESD sensitive device. It should also be appreciated that a plurality of magnetoresistive ESD event detectors can be electrically coupled in any combination with an ESD sensitive device such that the plurality of magnetoresistive ESD event detectors are able to detect an ESD event.

FIG. 3 is a flowchart illustrating a process 300 for detecting an ESD event. At step 310 a magnetoresistive ESD event detector is electrically coupled to an ESD sensitive device. The magnetoresistive ESD event detector includes at least one magnetoresistive device comprising an ESD sensitivity level that is greater than an ESD sensitivity level of the ESD sensitive device. In one embodiment, at step 312, a magnetoresistive ESD event detector is electrically coupled in series to an ESD sensitive device. In another embodiment, at step 314, a magnetoresistive ESD event detector is electrically coupled in parallel to an ESD sensitive device.

At step 320, a test is performed to detect the change of magnetoresistive properties of the at least one magnetoresistive device to determine if the ESD sensitive device was subject to an ESD event level. The ESD event level is greater than the ESD sensitivity level of the at least one magnetoresistive device. In one embodiment, at step 330, a test is performed for a pinned layer reversal of the at least one magnetoresistive device in response to the ESD event level greater than the ESD sensitivity level of the at least one magnetoresistive device. In another embodiment, at step 340, a test is performed for a resistance increase of the at least one magnetoresistive device in response to the ESD event level greater than the ESD sensitivity level of the at least one magnetoresistive device. In a further embodiment, at step 350, a test is performed for a resistance decrease of the at least one magnetoresistive device in response to the ESD event level greater than the ESD sensitivity level of the at least one magnetoresistive device.

At step 360, a test is performed for a change of magnetoresistive properties of a plurality of magnetoresistive devices. The plurality of magnetoresistive devices comprises a different ESD sensitivity level.

Various embodiments of the present invention are thus described. While the present invention has been described in particular embodiments, it should be appreciated that the present invention should not be construed as limited by such embodiments, but rather construed according to the following claims.

The invention claimed is:

1. A magnetoresistive electrostatic discharge (ESD) event detector comprising:
    at least one magnetoresistive device, wherein said at least one magnetoresistive device detects an ESD event in an ESD sensitive device based on magnetoresistive properties of said at least one magnetoresistive device, and wherein said at least one magnetoresistive device comprises an ESD sensitivity level that is greater than an ESD sensitivity level of said ESD sensitive device, wherein said ESD sensitivity level of said at least one magnetoresistive device is adjustable based at least in part on a group consisting of: a cross-sectional area of said at least one magnetoresistive device and a thickness of said at least one magnetoresistive device.

2. The detector of claim 1, wherein said at least one magnetoresistive device comprises:
   at least a portion of a giant magnetoresistive (GMR) transducer.

3. The detector of claim 1, wherein said at least one magnetoresistive device comprises:
   at least portion of a current-perpendicular-to-the-plane giant magnetoresistive (CPP GMR) transducer.

4. The detector of claim 1, wherein said at least one magnetoresistive device comprises:
   at least a portion of a tunneling magnetoresistive (TMR) transducer.

5. The detector of claim 1, wherein said magnetoresistive properties of said at least one magnetoresistive device comprises:
   a magnetic property, wherein said magnetic property comprises a pinned layer reversal in response to an ESD event that is greater than said ESD sensitivity level of said at least one said magnetoresistive device.

6. The detector of claim 1, wherein said magnetoresistive properties of said at least one magnetoresistive device comprises:
   a resistance, wherein said resistance of said at least one magnetoresistive device increases in response to an ESD event that is greater than said ESD sensitivity level of said at least one said magnetoresistive device.

7. The detector of claim 1, wherein said magnetoresistive properties of said at least one magnetoresistive device comprises:
   a resistance, wherein said resistance of said at least one magnetoresistive device decreases in response to an ESD event that is greater than said ESD sensitivity level of said at least one said magnetoresistive device.

8. The detector of claim 1, further comprising:
   said at least one magnetoresistive device electrically coupled to said ESD sensitive device, wherein said ESD sensitive device is potentially subject to said ESD event.

9. The detector of claim 8, wherein said at least one magnetoresistive device is a plurality of magnetoresistive devices electrically coupled in series to said ESD sensitive device, wherein each of said plurality of magnetoresistive devices comprises a different ESD sensitivity level.

10. The detector of claim 1, wherein said ESD event detector is disposed between said ESD sensitive device and said ESD event.

11. The detector of claim 1, wherein said ESD event detector comprising a size, wherein said size is smaller than a size of said ESD sensitive device.

12. A magnetoresistive electrostatic discharge (ESD) event detector comprising:
   at least one magnetoresistive device, wherein said at least one magnetoresistive device detects an ESD event in an ESD sensitive device based on magnetoresistive properties of said at least one magnetoresistive device, wherein said at least one magnetoresistive device comprises an ESD sensitivity level that is greater than an ESD sensitivity level of said ESD sensitive device, said at least one magnetoresistive device electrically coupled to said ESD sensitive device, wherein said ESD sensitive device is potentially subject to said ESD event and wherein said at least one magnetoresistive device is a plurality of magnetoresistive devices electrically coupled in parallel to said ESD sensitive device, wherein each of said plurality of magnetoresistive devices comprises a different ESD sensitivity level.

* * * * *